US008136061B2

(12) United States Patent
Dhong et al.

(10) Patent No.: US 8,136,061 B2
(45) Date of Patent: *Mar. 13, 2012

(54) METHOD OF LOGIC CIRCUIT SYNTHESIS AND DESIGN USING A DYNAMIC CIRCUIT LIBRARY

(75) Inventors: Sang Hoo Dhong, Austin, TX (US); Harm Peter Hofstee, Austin, TX (US); Stephen Douglas Posluszny, Round Rock, TX (US); Joel Abraham Silberman, Somers, NY (US); Osamu Takahashi, Round Rock, TX (US); Dieter F. Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 729 days.

This patent is subject to a terminal disclaimer.

(21) Appl. No.: 12/060,768

(22) Filed: Apr. 1, 2008

(65) Prior Publication Data
US 2008/0189670 A1 Aug. 7, 2008

Related U.S. Application Data

(63) Continuation of application No. 09/915,437, filed on Jul. 26, 2001, now Pat. No. 7,363,609.

(51) Int. Cl.
*G06F 17/50* (2006.01)
(52) U.S. Cl. .......................................... 716/104; 716/132
(58) Field of Classification Search ................... 716/101, 716/104, 132
See application file for complete search history.

(56) References Cited

U.S. PATENT DOCUMENTS

| 5,293,631 | A | | 3/1994 | Rau et al. |
|---|---|---|---|---|
| 5,596,743 | A | | 1/1997 | Bhat et al. |
| 5,649,165 | A | * | 7/1997 | Jain et al. ...................... 716/106 |
| 5,930,148 | A | * | 7/1999 | Bjorksten et al. .............. 716/104 |
| 6,018,621 | A | | 1/2000 | Puri et al. |
| 6,275,071 | B1 | | 8/2001 | Ye et al. |
| 6,308,313 | B1 | | 10/2001 | Lakshminarayana et al. |
| 6,333,656 | B1 | | 12/2001 | Schober |
| 6,360,356 | B1 | | 3/2002 | Eng |
| 6,367,065 | B1 | | 4/2002 | Leight et al. |
| 6,442,747 | B1 | | 8/2002 | Schzukin |
| 6,460,166 | B1 | | 10/2002 | Reddy et al. |
| 6,460,172 | B1 | | 10/2002 | Insenser Farre et al. |
| 6,470,486 | B1 | | 10/2002 | Knapp |
| 6,529,861 | B1 | * | 3/2003 | Patra et al. ...................... 703/14 |
| 6,543,036 | B1 | | 4/2003 | Iyer et al. |

(Continued)

OTHER PUBLICATIONS

Yee et al., "Dynamic Logic Synthesis," IEEE—Custom Integrated Circuits Conference, Seattle, Washington (Jan. 1997), 4 pages.
Puri et al., "Logic Optimization by Output Phase Assignment in Dynamic Logic Synthesis," IEEE (1996), 7 pages.

*Primary Examiner* — Jack Chiang
*Assistant Examiner* — Binh Tat
(74) *Attorney, Agent, or Firm* — Van Leeuwen & Van Leeuwen; Libby Z. Toub (57) ABSTRACT

The circuit library available for logic synthesis is limited to a single dynamic circuit block or logic synthesis block. The circuit design method includes first defining the logic synthesis block and then performing logic synthesis for a predetermined logical operation to be implemented. The logic synthesis step constrained to the single logic synthesis block produces an intermediate circuit design which necessarily comprises a series of dynamic circuit blocks, each associated with a single reset signal. Once the intermediate circuit is produced, the circuit design method includes eliminating unnecessary devices from the intermediate circuit to produce a final logic circuit, and then sizing the devices in the final circuit to complete the design.

10 Claims, 5 Drawing Sheets

U.S. PATENT DOCUMENTS

| | | |
|---|---|---|
| 6,546,541 B1 | 4/2003 | Petranovic et al. |
| 6,556,962 B1 * | 4/2003 | Patra .............................. 703/14 |
| 6,624,665 B2 | 9/2003 | Kim et al. |
| 6,637,018 B1 | 10/2003 | Demler |
| 6,651,234 B2 | 11/2003 | Gupta et al. |
| 6,721,926 B2 * | 4/2004 | Wang et al. .................. 716/104 |
| 6,766,506 B1 | 7/2004 | Ratzlaff et al. |
| 2004/0083435 A1 | 4/2004 | Gunderson et al. |

* cited by examiner

METHOD OF LOGIC CIRCUIT SYNTHESIS AND DESIGN USING A DYNAMIC CIRCUIT LIBRARY

CROSS-REFERENCE TO RELATED APPLICATION

This application is a continuation of U.S. patent application Ser. No. 09/915,437, filed Jul. 26, 2001 now U.S. Pat. No. 7,363,609 and entitled, "METHOD OF LOGIC CIRCUIT SYNTHESIS AND DESIGN USING A DYNAMIC CIRCUIT LIBRARY." The Applicants hereby claim the benefit of this U.S. patent application under 35 U.S.C. §120. The entire content of this U.S. patent application is incorporated herein by this reference.

TECHNICAL FIELD OF THE INVENTION

This invention relates to the design of digital logic circuits. More particularly, the invention relates to a method for synthesizing logic circuits from high-level logic representations.

BACKGROUND OF THE INVENTION

Logic circuits are electronic circuits that perform some logical operation or group of logical operations on a set of digital input data to provide some desired digital output. For example, a simple logic circuit may perform an AND operation on input data comprising three logic level signals to provide a single output comprising the logical signal resulting from the AND operation. These types of logic circuits are included in many different types of devices from control circuits for mechanical devices, to communications devices, to data processor chips. In many cases the logical operations may be very complicated and require complicated logic circuitry.

Logic circuit design involves first determining the particular logical function or operation which must be performed by the logic circuit. In this step, the designer works with high-level logic building blocks such as AND and OR gates to specify the logical operations to be performed in the final circuit design. When determining the logical operations required in the ultimate circuit, the designer is generally not concerned with the actual circuit elements required to provide the high-level logical operation or functionality.

After determining the high-level logic operations required of the final logic circuit, logic circuit design involves determining an arrangement of circuit elements to actually perform the desired logical operations. The step of determining the actual circuit elements and arrangement of circuit elements to provide the desired logical operations is referred to as logic synthesis. Logic synthesis may be performed by defining a set or library of available circuits and then identifying an arrangement of these available circuits which is capable of consistently providing the desired logical operation. Thus, logic synthesis comprises an optimization problem constrained by the library of available circuits available for synthesis, by the required logical operation to be performed by the final circuit, and perhaps by other constraints dictated by the designer. Various software tools have been developed to perform logic synthesis. These logic synthesis tools simply provide one or more solutions to the optimization problem, based upon a library of available circuits and other constraints provided by the designer.

Prior logic synthesis tools employ circuit libraries containing many different types of circuits. These prior circuit libraries include not only numerous different circuits, but may also include numerous versions of the same circuit, employing different sized circuit elements. Utilizing a large circuit library provides a certain flexibility in developing the ultimate circuit design. However, this flexibility comes at the cost of vastly increasing the complexity of the optimization problem which must be performed. This increase in complexity results in an increase in the processing time which the synthesis tool requires in order to produce a solution.

Another problem associated with prior static circuit logic synthesis involves the timing performance of the synthesized circuit. Timing between the signals applied to the input of the synthesized static circuit and the signals appearing at the output of the circuit is entirely dependent upon the manner in which signals propagate through the various static components of the circuit. Where the logic synthesis tool is not constrained by timing considerations, a constraint that further complicates the optimization problem to be performed, the timing associated with synthesized circuit may be unpredictable. The unpredictable timing associated with the synthesized static logic circuit may make the circuit difficult to use with other components of an overall system.

SUMMARY OF THE INVENTION

It is an object of the invention to provide a logic circuit design method which employs simplified logic synthesis. Another object of the invention is to provide a method of logic synthesis which utilizes a dynamic circuit library to simplify the optimization problem which the tool must solve and thereby reduce the processing time required for logic synthesis.

These objects are accomplished by limiting the library available for logic synthesis to a single dynamic circuit block or logic synthesis block. The circuit design method according to the invention includes first defining the logic synthesis block and then performing logic synthesis for a predetermined logical function to be implemented. The synthesis step may be performed by any suitable logic synthesis technique, in particular techniques performed by logic synthesis software tools, and results in an intermediate circuit design. This intermediate circuit design necessarily comprises a series of dynamic circuit blocks, each associated with a single reset signal. The invention then includes eliminating unnecessary devices from this intermediate circuit to produce a final logic circuit, and then sizing the devices in the final circuit to complete the design.

The preferred logic synthesis block comprises the largest practical dynamic AND/OR circuit. The maximum size of this preferred AND/OR circuit is determined generally by the technology in which the circuit is to be implemented. One preferred form of the invention defines a four high and four wide AND/OR block utilizing a single reset signal for the entire block. Regardless of the logic synthesis block defined for the logic synthesis step, the logic synthesis step is preferably performed without constraining the size of the various devices making up the logic synthesis block circuit. Sizing the various devices in the synthesized logic circuit to ensure that the circuit consistently provides the desired logical operation is left as a separate step performed after logic synthesis.

The method according to the invention allows the circuit designer to take advantage of dynamic logic circuitry to improve overall performance of the desired logic circuit. The resulting delayed-reset dynamic logic circuit having a fixed number of reset levels is relatively easy to construct and ensure proper operation as compared to generic dynamic circuits. Perhaps most importantly, limiting the logic synthesis step to a circuit library consisting of a single logic circuit greatly simplifies the logic synthesis step. The remaining steps to finalize the circuit design, that is, the steps of eliminating unnecessary or unused devices in the synthesized intermediate circuit and then sizing the devices in the final circuit, are straightforward tasks which can be done manually or by some automated means.

These and other objects, advantages, and features of the invention will be apparent from the following description of the preferred embodiments, considered along with the accompanying drawings.

DESCRIPTION OF THE PREFERRED EMBODIMENTS

Figure 1:
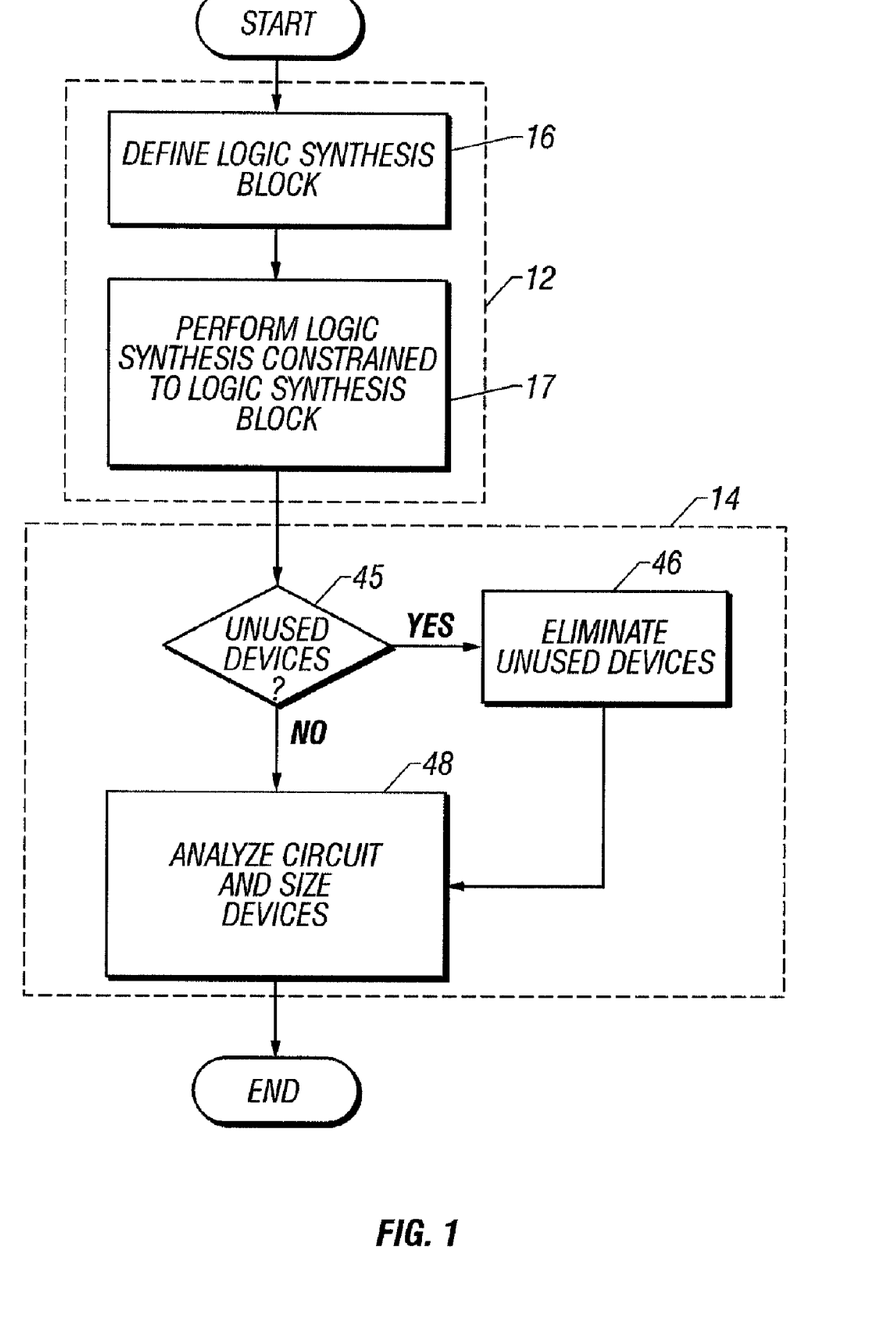
FIG. 1 comprises a flowchart showing a circuit design method embodying the principles of the invention.

FIG. 1 illustrates the process steps included in a logic circuit design process embodying the principles of the invention. The design process involves a logic synthesis component shown in dashed box 12 and a design component shown in dashed box 14. Steps in logic synthesis component 12 produce an intermediate logic circuit design, described below with reference to FIG. 4, which performs a desired logical operation. Steps in design component 14 use this intermediate logic circuit design to provide an efficient final logic circuit for performing the desired logical operation.

The process starts with the designer providing or defining the high level logical operation to be performed by the circuit. According to the invention, logic synthesis component 12 includes first defining a logic synthesis block as shown at process block 16. The process next includes performing logic synthesis as shown at process block 17 to produce the intermediate circuit capable of performing the predetermined logical operation. According to the invention, this logic synthesis step 17 is constrained to a circuit library including only the logic synthesis block.

Defining the logic synthesis block for use in logic synthesis according to the invention preferably includes defining the largest practical dynamic AND/OR circuit which may be used in the technology in which the circuit is to be implemented. This dynamic circuit is controlled by a single reset signal. The largest practical dynamic AND/OR circuit may, for example, comprise a four high and four wide dynamic AND/OR circuit. This four high and four wide AND/OR circuit will be referred to further in this disclosure and shown in the drawings as a "4A4O" circuit.

Figure 2:
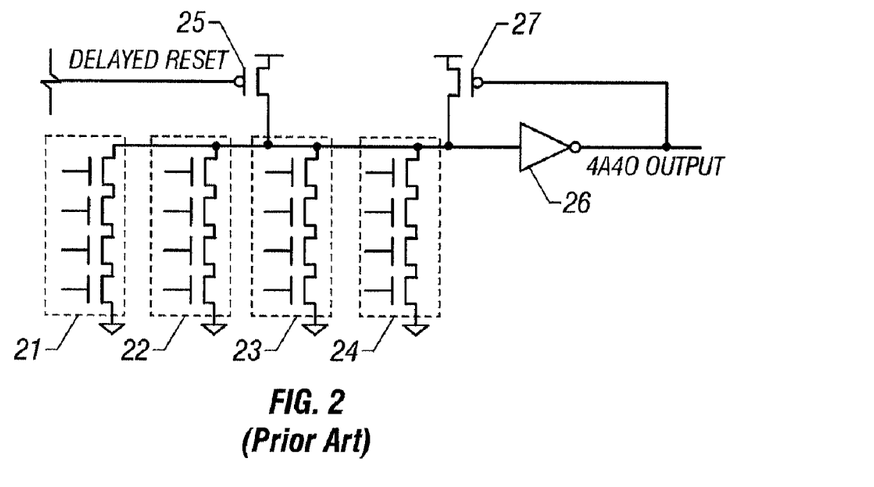
FIG. 2 is an electrical schematic diagram of a prior art four high and four wide unfooted dynamic AND/OR circuit.
Figure 3:
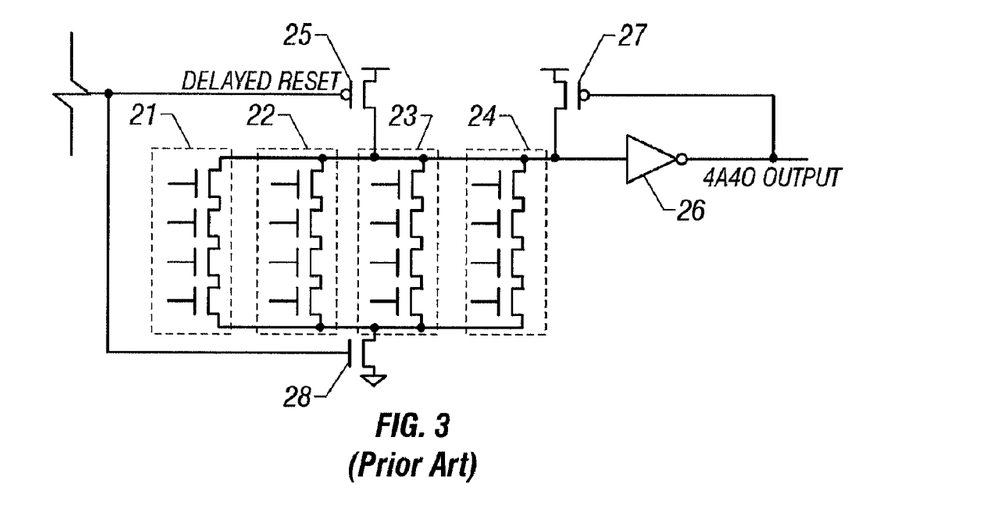
FIG. 3 is an electrical schematic diagram of a prior art four high and four wide footed dynamic AND/OR circuit.

FIGS. 2 and 3 show examples of dynamic 4A4O circuits. Each of these circuits is capable of receiving up to four input signals at each of four groups of N-type devices. The first group of four N-type devices is shown in dashed box 21 in FIGS. 2 and 3, while the remaining groups are shown at dashed boxes 22, 23, and 24. The inputs of the devices included in a single group 21, 22, 23, or 24 are ANDed and then ORed with inputs at the other groups. Each circuit includes a reset device 25 and output inverter 26 and feedback device 27. FIG. 2 shows an unfooted 4A4O circuit while FIG. 3 shows a 4A4O circuit including a footer device 28 which also receives the reset signal. 4A4O circuits are preferred for use as the logic synthesis block according to the invention because it is possible to produce a large number of logical combinations from the circuit. The 4A4O logic block also takes advantage of the maximum practical stack height, that is, the maximum number of devices that may be stacked between $V_{dd}$ and ground, which may currently be implemented.

Those skilled in the art will appreciate that the input signals to the devices in groups 21, 22, 23, and 24 are logic level signals comprising either a high logic level signal representing one binary value or a low logic level signal representing the opposite binary value. The actual voltage of the various signals will depend upon the implementation technology. The invention is not limited to any particular high or low level logic signals or any implementation technology. Furthermore, the invention is not limited to using 4A4O circuits as the logic synthesis blocks. These 4A4O logic synthesis blocks simply represent one preferred form of the invention.

Figure 4:
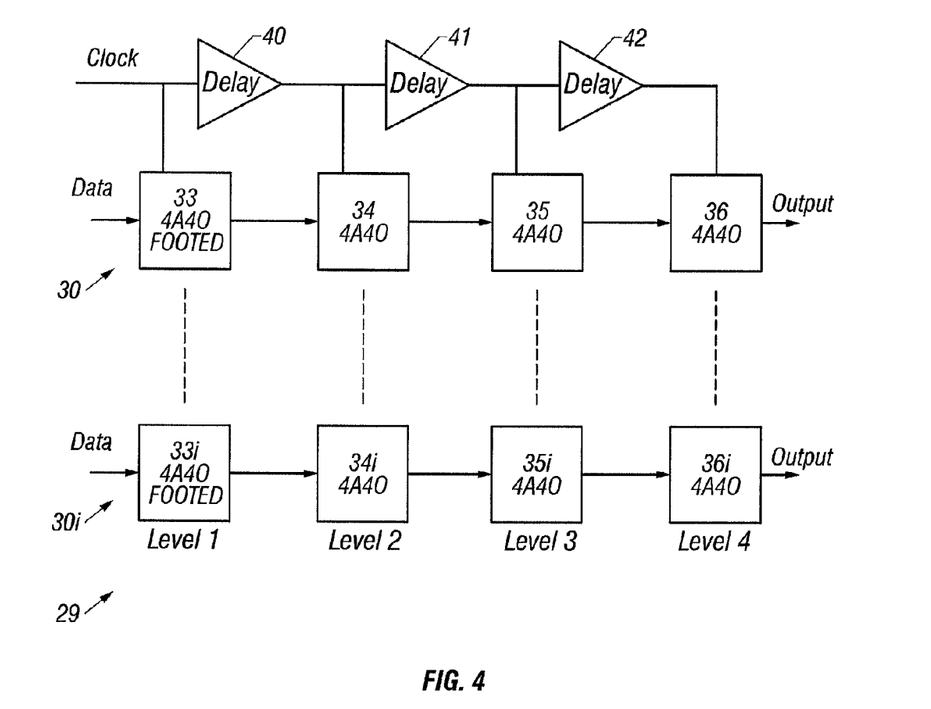
FIG. 4 is a diagrammatic representation of an assembly of logic synthesis blocks resulting from logic synthesis performed according to the invention.

The result or output of logic synthesis at step 17 in FIG. 1 is an intermediate circuit 29 comprising an assembly of at least one string 30 of logic synthesis blocks 33, 34, 35, and 36. Such an assembly having an indeterminate number of strings 30 is shown in FIG. 4. The logic synthesis blocks in the lowermost string 30*i* in the drawing are labeled as 33*i*, 34*i*, 35*i*, and 36*i* to indicate that the string is the last of some indeterminate number of strings. Each logic synthesis block 33 to 33*i*, 34 to 34*i*, 35 to 35*i*, or 36 to 36*i* in each string 30 to 30*i* comprises the circuit defined as the logic synthesis block for purposes of performing logic synthesis at step 17. Since the logic synthesis step according to the invention may only select a single type of circuit to combine in some manner to produce the predefined logical operation, the result of logic synthesis at step 17 in FIG. 1 will inevitably result in some combination of strings 30 to 30*i* which include only the defined logic synthesis block. As will be discussed further below however, not all of the functionality of each logic synthesis block will be used to provide the desired logical operation.

The invention will be described further with reference to the preferred logic synthesis block comprising a 4A4O circuit as described above, and in particular a footed 4A4O circuit such as shown in FIG. 3. It will be appreciated, however, that the invention is not limited to this particular circuit for use as the logic synthesis block.

In the example shown in FIG. 4, each string 30 to 30*i* of logic synthesis blocks includes four levels of 4A4O blocks. The level one blocks for the various strings comprise blocks 33 to 33*i*, the level two blocks comprise blocks 34 to 34*i*, the level three blocks comprise blocks 35 to 35*i*, and the level four blocks comprise blocks 36 to 36*i*. Level one block 33 to 33*i* will typically comprise the footed version of the defined logic synthesis block while the blocks on the following levels, such as blocks 34 to 34*i*, 35 to 35*i*, and 36 to 36*i* in the example, may comprise the unfooted version of the defined logic synthesis block. It will be appreciated that there will be a characteristic delay for the reset signal provided to each successive logic synthesis block level. The delay between the reset signal applied to the level one blocks 33 to 33*i* and the level two blocks 34 to 34*i* is represented by delay element 40. The delays associated with the level three blocks 35 to 35*i* and level four blocks 36 to 36*i*, are represented by delay elements 41 and 42, respectively. These delays are required to allow the desired data to propagate through the various logic synthesis blocks included in the assembly and provide the desired output for application to the next succeeding block.

The logic synthesis step shown at process block 17 may be performed in any suitable fashion. In particular, the logic synthesis step may be performed by a logic synthesis software tool executed by a suitable processing device. The Synopsys Design Compiler™ logic synthesis tool by Synopsys, Inc. of Mountain View, Calif. is an example of a logic synthesis software tool which may be employed to perform the logic synthesis step according to the invention.

Although the library available for logic synthesis is constrained to the single logic synthesis block, the preferred form of the invention includes leaving the size of devices included in the logic synthesis block substantially unconstrained. That is, rather than including in the logic synthesis library a number of the logic synthesis blocks each with a different combination of device sizes, the logic synthesis step is performed with a generic logic synthesis block. This preferred generic logic synthesis block is assumed to be capable of meeting drive requirements and providing the desired logical operations based upon the general or generic operational characteristics of the various devices included in the circuit.

Referring back to FIG. 1, the design component processes shown at dashed box 14 use the intermediate circuit produced through logic synthesis step 17 to produce a final circuit. It will be unlikely that the intermediate circuit 29 shown in FIG. 4 will actually require all of the functionality available in each 4A4O circuit, logic synthesis block 33 to 33*i*, 34 to 34*i*, 35 to 35*i*, and 36 to 36*i* included in the intermediate circuit. At least some of the devices included in the various logic synthesis blocks 33 to 33*i*, 34 to 34*i*, 35 to 35*i*, and 36 to 36*i* will be unused in effecting the final logical operation performed by the intermediate circuit. Thus, the design component processes shown in dashed box 14 preferably include determining if there are unused devices in the intermediate circuit 29. This step is shown at decision box 45 in FIG. 1. If there are unused devices in the intermediate circuit 29 made up of logic synthesis blocks, the process includes eliminating those unused or unnecessary devices as shown at process block 46 in FIG. 1. The steps of detecting unused devices in intermediate circuit 29 and eliminating those unused devices may be described with reference to a simple example shown in FIGS. 5 and 6.

Figure 5:
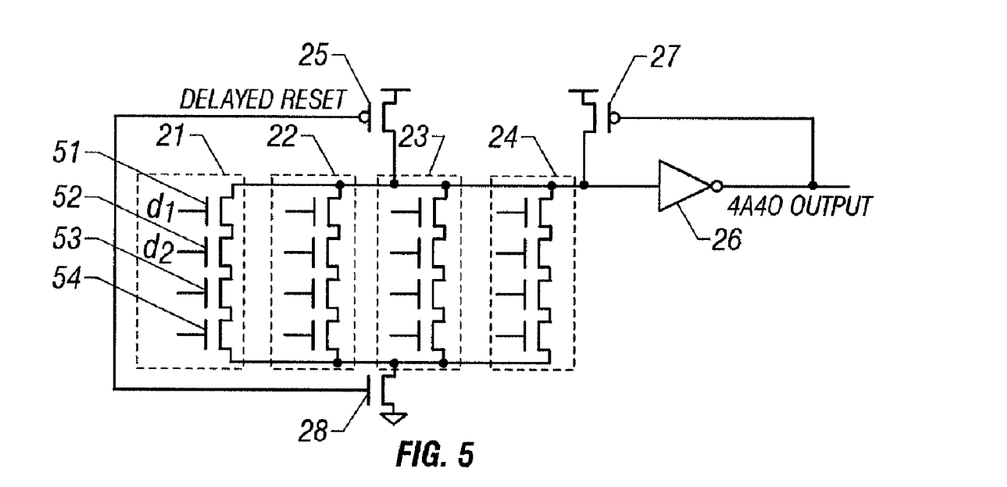
FIG. 5 is an electrical schematic diagram of one logic synthesis block included in the assembly shown in FIG. 4.

FIG. 5 shows a single level, for example the level one 4A4O block 33 from FIG. 4. It is assumed for the purposes of this example that the synthesized intermediate circuit 29 which includes first level block 33 simply ANDs two input signals to that particular block and that the result of the AND operation is output from the first level block to second level block 34 shown in FIG. 4. In this case, the logic synthesis step selects the first group of devices 21 in the block, and particularly devices 51 and 52 for receiving the input signals $d_1$ and $d_2$. The logic synthesis step performed at block 17 also must specify the inputs to devices 53 and 54 in that group of devices to each receive a high-level logic signal so as not to interfere with the AND operation provided through devices 51 and 52. Devices in the other groups, 22, 23, and 24 would each receive a common level signal, preferably a low level signal since they are not relevant in providing the desired AND function in the first level logic block 33. Since devices 53 and 54 as well as all of the devices in groups 22, 23 and 24 do not affect the logical operation provided by the intermediate circuit in which they are included, all of these devices may be removed from the circuit without affecting the operation of the circuit. That is, devices 53 and 54 and all devices in groups 22, 23, and 24 may be removed from the intermediate circuit without affecting the desired AND function provided through devices 51 and 52.

The result of the logic synthesis step shown at process block 17 in FIG. 1 will indicate any devices in the various logic synthesis blocks 33 to 33*i*, 34 to 34*i*, 35 to 35*i*, and 36 to 36*i* included in intermediate circuit 29 which do not change state in the operation of the circuit. Removing these unused or unnecessary devices from intermediate circuit 29 is thus preferably performed by detecting any devices in the synthesized intermediate circuit which do not change state in the operation of the circuit, and then eliminating those detected devices from the intermediate circuit. These steps may be performed manually or in some automated fashion through a suitable software tool operating on the result or output of logic synthesis step 17 in FIG. 1.

Figure 6:
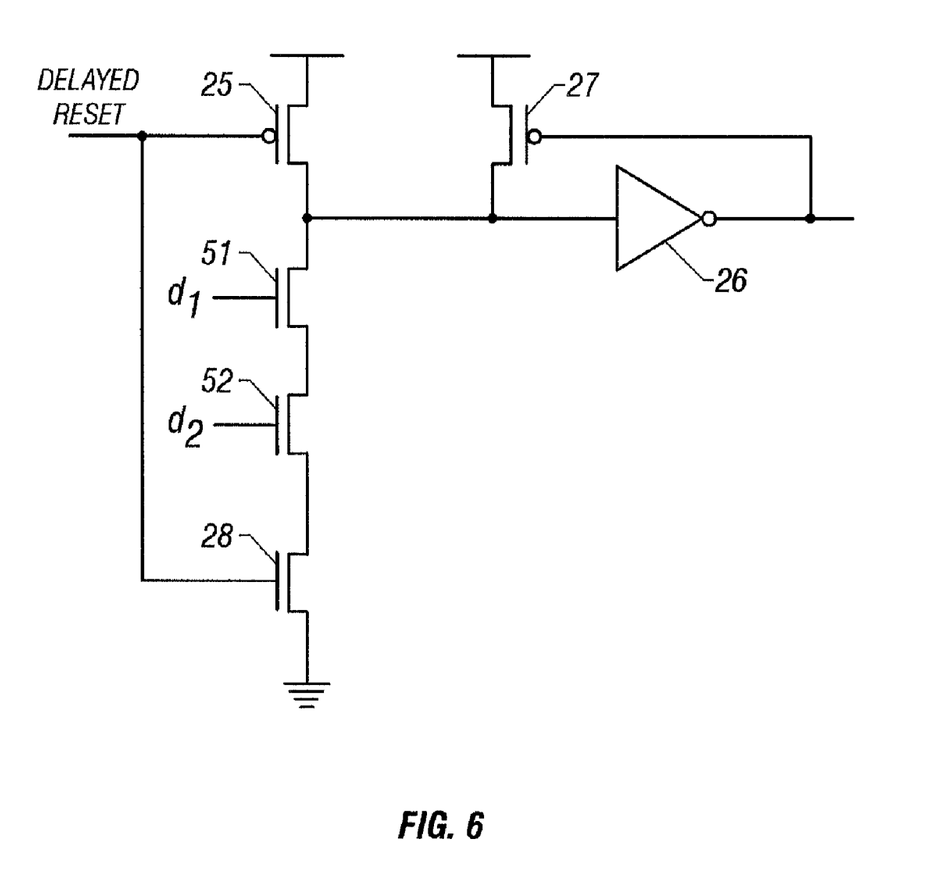
FIG. 6 is an electrical schematic diagram showing the final circuit corresponding to the respective logic synthesis block after removing unused devices from the circuit shown in FIG. 5.

Regardless of how unused devices are detected and removed from the intermediate circuit design, the resulting circuit may be referred to as a final circuit or final circuit design. FIG. 6 shows the portion of the final circuit remaining from block 33 in our example described above with reference to FIG. 5. This first level portion of the final circuit includes only devices 51 and 52, along with reset device 25, footer device 28, output inverter 26, and feedback/pull-up device 27.

Once there are no more unused or unnecessary devices to remove from the intermediate circuit, the present circuit design process includes the step of analyzing the circuit to determine the size of devices remaining in the final circuit necessary to provide the desired functionality. This sizing step is shown at process block 48 in FIG. 1, and involves determining the drive strength required of the various devices. For example, devices 51 and 52 in the AND circuit shown in FIG. 6 may be sized differently than devices included in a full group such as group 22 in FIG. 5, should the full group of devices remain in the final circuit. Determining the size of the various devices in a logic circuit in order to provide the desired logic function for a given supply voltage and other operating conditions is well known in the field of circuit design and will not be discussed here in further detail.

The logic circuit design method according to the invention drastically simplifies the optimization problem required to perform logic synthesis. Thus, the processing time required for synthesizing complex logic circuitry is greatly reduced by the invention. Reset signal generation and timing is also greatly simplified using a fixed number of levels of delayed-reset dynamic circuit elements. Furthermore, leaving the device size in the logic synthesis block unconstrained as in the preferred form of the invention allows the designer to set device size to keep a fairly constant delay for each block at each level in the final circuit. This in turn allows unfooted blocks to be used in subsequent levels of the final circuit without running into reset timing problems.

The above described preferred embodiments are intended to illustrate the principles of the invention, but not to limit the scope of the invention. Various other embodiments and modifications to these preferred embodiments may be made by those skilled in the art without departing from the scope of the following claims. For example, although the synthesized intermediate circuit 29 is described as having four dynamic block levels for purposes of example, the invention is not limited to a four level dynamic circuit. Also, the invention is not limited to any particular logic synthesis technique as long as the library of circuits available in the technique is limited to a single logic circuit or logic synthesis block.

The invention claimed is:

1. A method of producing a final circuit design for use in synthesizing a logic circuit to provide a predetermined logical operation, the method including the steps of:
   defining a logic synthesis block that corresponds to a single dynamic logic circuit, wherein the defining includes selecting a largest practical dynamic circuit corresponding to a circuit fabrication technology utilized by the final circuit design;
   selecting, by a processing device, a synthesis library that is constrained to only the logic synthesis block;
   performing, by the processing device, logic synthesis for the predetermined logical operation utilizing the selected synthesis library, wherein the logic synthesis generates an intermediate circuit design that includes only a plurality of the logic synthesis blocks;
   eliminating unused devices in the intermediate circuit design to produce the final circuit design; and
   sizing the devices in the final circuit design.

2. The method of claim 1 wherein the largest practical dynamic circuit is a dynamic AND/OR circuit.

3. The method of claim 1 wherein the logic synthesis block comprises a four high and four wide dynamic AND/OR circuit.

4. The method of claim 1 wherein the step of performing logic synthesis for the predetermined logical operation includes leaving devices size in the logic synthesis block substantially unconstrained.

5. The method of claim 1 wherein the dynamic logic circuit comprising the logic synthesis block operates using a single activation/reset clock signal.

6. In a circuit design method utilizing a logic synthesis tool and predefined logic circuit library to provide a logic implementation for a predetermined logical operation, the method comprising:
   defining a logic synthesis block that corresponds to a single dynamic logic circuit, wherein the defining includes selecting a largest practical dynamic circuit corresponding to a circuit fabrication technology utilized by a final circuit design;
   selecting, by a processing device, a synthesis library that is constrained to only the logic synthesis block;
   performing, by the processing device, logic synthesis for the predetermined logical operation utilizing the selected synthesis library, wherein the logic synthesis generates an intermediate circuit design that includes only a plurality of the logic synthesis blocks;
   eliminating unused devices in the intermediate circuit design to produce a final circuit design; and
   sizing the devices in the final circuit design.

7. The method of claim 6 wherein the largest practical dynamic circuit is a dynamic AND/OR circuit.

8. The method of claim 6 wherein the logic synthesis block comprises a four high and four wide dynamic AND/OR circuit.

9. The method of claim 6 further including the step of leaving the device size in the logic synthesis block substantially unconstrained for the logic synthesis tool.

10. The method of claim 6 wherein the logic synthesis block uses a single activation/reset clock input.

* * * * *